United States Patent
Flynn et al.

(10) Patent No.: US 8,156,392 B2
(45) Date of Patent: Apr. 10, 2012

(54) APPARATUS, SYSTEM, AND METHOD FOR BAD BLOCK REMAPPING

(75) Inventors: David Flynn, Sandy, UT (US); John Strasser, Syracuse, UT (US); Jonathan Thatcher, Lehi, UT (US); David Atkisson, Draper, UT (US); Michael Zappe, Wheat Ridge, CO (US); Joshua Aune, South Jordan, UT (US); Kevin Vigor, Salt Lake City, UT (US)

(73) Assignee: Fusion-IO, Inc., Salt Lake City, UT (US)

(*) Notice: Subject to any disclaimer, the term of this patent is extended or adjusted under 35 U.S.C. 154(b) by 212 days.

(21) Appl. No.: 12/419,223

(22) Filed: Apr. 6, 2009

(65) Prior Publication Data

US 2009/0282301 A1 Nov. 12, 2009

Related U.S. Application Data

(60) Provisional application No. 61/042,738, filed on Apr. 5, 2008.

(51) Int. Cl.
*G01R 31/28* (2006.01)

(52) U.S. Cl. ............... 714/723; 714/2; 714/3; 714/5; 714/7; 714/8; 714/742; 365/185.01; 365/185.09; 365/200

(58) Field of Classification Search .................. None
See application file for complete search history.

(56) References Cited

U.S. PATENT DOCUMENTS

| | | | |
|---|---|---|---|
| 5,404,485 A * | 4/1995 | Ban .................. | 711/202 |
| 5,740,188 A | 4/1998 | Olarig | |
| 5,740,349 A * | 4/1998 | Hasbun et al. ........ | 714/8 |
| 5,841,795 A | 11/1998 | Olarig et al. | |
| 5,867,641 A | 2/1999 | Jenett | |
| 5,922,080 A | 7/1999 | Olarig | |
| 5,978,953 A | 11/1999 | Olarig | |

(Continued)

FOREIGN PATENT DOCUMENTS

EP 1418502 A2 5/2004

(Continued)

OTHER PUBLICATIONS

XSR 1.5, Bad Block Management, Application Note, May 2007, Version 1.0, Flash Software Group, Samsung Electronics Co., Ltd, http://www.samsung.com/global/business/semiconductor/products/flash/FlashApplicationNote.html.

(Continued)

*Primary Examiner* — John P Trimmings

(74) *Attorney, Agent, or Firm* — Wells St. John, P.S.

(57) ABSTRACT

An apparatus, system, and method are disclosed for bad block remapping. A bad block identifier module identifies one or more data blocks on a solid-state storage element as bad blocks. A log update module writes at least a location of each bad block identified by the bad block identifier module into each of two or more redundant bad block logs. A bad block mapping module accesses at least one bad block log during a start-up operation to create in memory a bad block map. The bad block map includes a mapping between the bad block locations in the bad block log and a corresponding location of a replacement block for each bad block location. Data is stored in each replacement block instead of the corresponding bad block. The bad block mapping module creates the bad block map using one of a replacement block location and a bad block mapping algorithm.

22 Claims, 8 Drawing Sheets

U.S. PATENT DOCUMENTS

| | | | |
|---|---|---|---|
| 6,003,144 | A | 12/1999 | Olarig et al. |
| 6,014,724 | A | 1/2000 | Jenett |
| 6,014,755 | A | 1/2000 | Wells et al. |
| 6,024,486 | A | 2/2000 | Olarig et al. |
| 7,013,376 | B2 | 3/2006 | Hooper, III |
| 7,085,879 | B2 | 8/2006 | Aasheim et al. |
| 7,366,825 | B2 * | 4/2008 | Williams et al. ............... 711/103 |
| 2003/0128618 | A1 | 7/2003 | Harari et al. |
| 2003/0163633 | A1 | 8/2003 | Aasheim et al. |
| 2004/0163027 | A1 | 8/2004 | MacLaren et al. |
| 2004/0163028 | A1 | 8/2004 | Olarig |
| 2006/0013048 | A1 * | 1/2006 | Kim ............................. 365/200 |
| 2006/0031710 | A1 * | 2/2006 | Jo ..................................... 714/5 |
| 2006/0109725 | A1 * | 5/2006 | Yoon et al. .................... 365/200 |
| 2006/0282644 | A1 | 12/2006 | Wong |
| 2006/0291304 | A1 | 12/2006 | Rothman et al. |
| 2007/0081401 | A1 * | 4/2007 | Chen ............................ 365/200 |
| 2007/0109856 | A1 * | 5/2007 | Pellicone et al. ......... 365/185.09 |
| 2008/0059835 | A1 | 3/2008 | Yoon |
| 2008/0082736 | A1 | 4/2008 | Chow et al. |
| 2008/0155317 | A1 * | 6/2008 | Kim et al. .......................... 714/8 |
| 2009/0210636 | A1 | 8/2009 | Karamcheti et al. |

FOREIGN PATENT DOCUMENTS

EP          1418502  A3      5/2004

OTHER PUBLICATIONS

Bad Block Management, XSR 1.5 Application Note, May 2007, Version 1.0, Flash Software Group, Samsung Electronics Co., Ltd, http://www.samsung.com/global/business/semiconductor/products/flash/FlashApplicationNote.html.

PCT/US2009/039684, 2380.2.22pct, International Preliminary Report on Patentability, Oct. 14, 2010.

BiTMICRO Introduces E-Disk PMC Flash Disk Module at Military & Aerospace Electronics East, May 18, 2004, BiTMICRO, http://www.bitmicro.com/press_news_releases_20040518_prt.php.

PCT/US2009/039684_2380.2.22pct_International Search Report_Sep. 17, 2009.

ASPMC_660, Asine Group, http://www.asinegroup.com/products/aspmc660.html, copyright 2002, downloaded on Nov. 18, 2009.

"BiTMICRO Introduces E-Disk PMC Flash Disk Module at Military & Aerospace Electronics East 2004", BiTMICRO, http://www.bitmicro.com/press_news_releases_20040518_prt.php.

NAND Flash 101: An Introduction to NAND Flash and How to Design It in to Your Next Product, Micron, pp. 1-28, Micron Technology Nov. 2006.

STMicroelectronics, "Bad Block Management in NAND Flash Memories," Application note AN-1819 by STMicroelectronics (Geneva, Switzerland), May 19, 2004.

* cited by examiner

US 8,156,392 B2

APPARATUS, SYSTEM, AND METHOD FOR BAD BLOCK REMAPPING

CROSS-REFERENCES TO RELATED APPLICATIONS

This application claims priority to U.S. Provisional Patent Application No. 61/042,738 entitled "Apparatus, System, and Method for Bad Block Remapping" and filed on Apr. 5, 2008 for David Flynn, et al., which is incorporated herein by reference.

BACKGROUND

1. Field of the Invention

This invention relates to solid-state storage and more particularly relates to bad block remapping in solid-state storage.

2. Description of the Related Art

Solid-state storage, as well as other forms of data storage media, is subject to failures of specific regions within the solid-state storage. This type of failure may result in loss of ability to store data in the specific failed region, but rest of the solid-state storage may function normally. Allowing the failed region to be used for data storage would introduce data errors.

Memory cells in solid-state storage are typically arranged in some type of a matrix of rows and columns. Regions may further be divided into pages, erase blocks (or other block), etc. The pages, erase blocks, etc. may be numbered in some fashion, such as sequentially numbered. The numbering may be used in an address to locate a specific page and then row and column numbers may be used to access bits, bytes, etc.

When solid-state storage elements, such as dies or chips, are arranged in an array, the solid-state storage elements may also be numbered, and may be arranged in banks, rows, etc. The bank number, row number, element number, etc. associated with the solid-state storage array may also then form part of an address scheme. Pages, erase blocks, etc. may be grouped together to form logical pages, logical erase blocks, etc.

To avoid loss of use of an entire data storage device, a location where the data storage device has failed may be noted and marked such that data is not stored in the bad location. Often, a region that is marked bad is a block. A bad block table or other data structure may be used to avoid storing data in a bad block. If a particular physical erase block in a solid-state storage array fails, a logical erase block that includes the failed physical erase block may be unavailable unless another physical erase block is substituted for the failed physical erase block. A bad block map is typically used to redirect data reads, writes, etc. from the failed physical erase block in a logical erase block being accessed to a replacement physical erase block.

Bad blocks in solid-state storage, such as NAND flash memory, are common and solid-state storage elements often come from the factory with bad erase blocks. Solid-state storage may be used as log storage system and not as a random access device so bad block mapping schemes developed for disks and other data storage devices may be inadequate. Solid-state storage typically also has a wear-out mechanism so areas used frequently may be subject to failure before other areas in the solid-state storage. Traditional bad block management techniques are inadequate for providing highly reliable bad block management for solid-state storage.

SUMMARY

From the foregoing discussion, it should be apparent that a need exists for an apparatus, system, and method that provide a highly reliable way to manage bad blocks in solid-state storage. Beneficially, such an apparatus, system, and method would provide a highly reliable, time efficient bad block management that does not interfere with solid-state storage performance.

The present invention has been developed in response to the present state of the art, and in particular, in response to the problems and needs in the art that have not yet been fully solved by currently available bad block mapping systems. Accordingly, the present invention has been developed to provide an apparatus, system, and method for bad block remapping that overcome many or all of the above-discussed shortcomings in the art.

The apparatus for bad block remapping is provided with a plurality of modules configured to functionally execute the necessary steps of identifying one or more data blocks as bad blocks, writing at least a location of each bad block into each of two or more redundant bad block logs, and accessing at least one bad block log during a start-up operation to create in memory a bad block map. These modules in the described embodiments include a bad block identifier module, a log update module, and a bad block mapping module.

The bad block identifier module identifies one or more data blocks as bad blocks. Each bad block includes a block determined to be inappropriate for data storage. Each bad block is on a solid-state storage element in an array of solid-state storage elements.

The log update module writes at least a location of each bad block ("bad block location") identified by the bad block identifier module into each of two or more redundant bad block logs. For at least one of the bad block logs, the log update module writes the one or more bad block locations into a page of a block of the bad block log. The page is free of previously written bad block location information.

The bad block mapping module accesses at least one bad block log during a start-up operation to create in memory a bad block map. The bad block map includes a mapping between the bad block locations in the bad block log and a corresponding location of a replacement block ("replacement block location") for each bad block location. Data is stored in each replacement block instead of the corresponding bad block. The start-up operation includes making operational a controller for the solid-state storage from a non-operational state. In one embodiment, the bad block mapping module creates the bad block map using a replacement block location stored with each bad block location in each of the bad block logs. In another embodiment, the bad block mapping module creates the bad block map using a bad block mapping algorithm that uses a storage order of the bad block locations in a bad block log to pair each bad block location with a replacement block location.

In one embodiment, the apparatus includes a table updater module that updates the bad block map by mapping a replacement block location to a bad block location. The table updater module stores the mapping in the bad block map. In another embodiment, the apparatus includes a log compactor module that reads, in a block of a bad block log, each page storing one or more bad block locations. The log compactor module also erases the pages storing bad block locations and stores at least the bad block locations read from the pages together into one or more pages in the block of the bad block log ("compacted bad block pages"). In yet another embodiment, the log compactor module erases pages storing bad block locations and stores the bad block map in one or more pages of the block that include the bad block log as compacted bad block pages.

In a further embodiment, the log update module, subsequent to the log compactor module storing bad block locations into the one or more compacted bad block pages, stores each additional bad block location corresponding to a bad block subsequently identified by the bad block identifier module. Each additional bad block location is stored in a separate page and in a page different than the one or more compacted bad block pages.

In a further embodiment, the log compactor module reads one or more compacted bad block pages and other pages storing a bad block location and stores the bad block locations in one or more compacted bad block pages. In another embodiment, the log compactor module reads pages and stores bad block locations in one or more compacted bad block pages in response to one or more of reaching a threshold of number of pages with bad block location information and each available page in a bad block log having one or more bad block locations.

In one embodiment, the apparatus includes a bad block recovery module that recovers valid data stored in an identified bad block and stores the data in a replacement block mapped to the bad block. The bad block recovery module recovers the valid data using error correcting code ("ECC"), a spare die or chip from which the valid data can be covered, or data stored in a stripe of a redundant array of independent drives ("RAID").

In another embodiment, the apparatus includes a log consistency module that compares the two or more bad block logs and, if available, the bad block map and determines if the bad block logs and bad block map are consistent. In a further embodiment, the log consistency module determines consistency of the bad block logs and bad block map in response to one or more of detecting an error while updating one or more of the bad block logs, the bad block mapping module creating the bad block map during a start-up operation, after an interruption while updating the two or more bad block logs, an ECC data correction failure, a periodic scrubbing, expiration of a period of time, and a command by a user.

In a further embodiment, the apparatus includes a log recovery module that uses a bad block log that is determined to be correct or the bad block map that is determined to be correct to correct a bad block log that is determined to be in error. In another embodiment, determining that two or more bad block logs are inconsistent includes determining that a number of bad block locations in a bad block log or the bad block map are different than a number of bad block locations in at least one other bad block log. In another embodiment, the bad block log with a higher number of bad block locations is determined to be the bad block log with valid bad block location data unless the bad block log with a higher number of bad block locations is determined to contain invalid data using ECC checking.

In one embodiment, a replacement block includes a physical block within a retired logical block. The retired logical block includes two or more physical blocks wherein at least one physical block is a physical block other than the replacement block and is a bad block. The retired logical block also includes a logical block available to store data that is marked as a retired logical block such that physical blocks in the logical block are available as replacement blocks.

In another embodiment, a block of a bad block log includes a logical block spanning two or more solid-state storage elements wherein ECC protects the logical block. In another embodiment, the bad block mapping module accesses at least one bad block log by accessing the block of the bad block log at a known physical location within the solid-state storage array. The known physical location includes one of a first block, a last block, a block of a predetermined number, and a block at a known offset into the solid-state storage array.

In one embodiment, the apparatus includes a bad block log replacement module that determines that a block that includes a bad block log is in a condition to be replaced, selects a block within a pool of blocks designated for bad block data storage, and writes bad block data into the selected block that is consistent with one of another bad block log and the bad block map. In another embodiment, the log update module further stores one or more of a time indicator and error data with the bad block location. The time indicator includes a point in time or a point in a sequence. The point in time and point in sequence are each associated with identification of the bad block.

In yet another embodiment, a solid-state storage element includes one of a solid-state storage chip and a solid-state storage die. In one embodiment, a block is an erase block.

A system of the present invention is also presented for bad block remapping. The system may be embodied by a solid-state storage array including two or more solid-state storage elements and a solid-state storage controller that controls the solid-state storage array. In particular, the system, in one embodiment, includes a bad block identifier module, a log update module, and a bad block mapping module. The bad block identifier module identifies one or more data blocks as bad blocks. Each bad block includes a block determined to be inappropriate for data storage and each bad block is on a solid-state storage element in the solid-state storage array.

The log update module writes at least a location of each bad block ("bad block location") identified by the bad block identifier module into each of two or more redundant bad block logs. For at least one of the bad block logs the log update module writes the one or more bad block locations into a page of a block of the bad block log, where the page is free of previously written bad block location information.

The bad block mapping module accesses at least one bad block log during a start-up operation to create in memory a bad block map. The bad block map includes a mapping between the bad block locations in the bad block log and a corresponding location of a replacement block ("replacement block location") for each bad block location. Data is stored in each replacement block instead of the corresponding bad block. The start-up operation includes making operational a controller for the solid-state storage from a non-operational state. The bad block mapping module creates the bad block map using one of a replacement block location stored with each bad block location in each of the bad block logs and a bad block mapping algorithm that uses a storage order of the bad block locations in a bad block log to pair each bad block location with a replacement block location. The system, in one embodiment, may further include a computer that includes the solid-state storage array.

A computer program product comprising a computer readable medium having computer usable program code executable to perform operations is also presented for mapping bad blocks in solid-state storage. The computer program product includes identifying one or more data blocks as bad blocks. Each bad block includes a block determined to be inappropriate for data storage. Each bad block is on a solid-state storage element in an array of solid-state storage elements. The computer program product also includes writing at least a location of each identified bad block ("bad block location") into each of two or more redundant bad block logs. For at least one of the bad block logs, the one or more bad block locations are written into a page of a block that includes the bad block log, where the page is free of previously written bad block location information.

The computer program product includes accessing at least one bad block log during a start-up operation to create in memory a bad block map that includes a mapping between the bad block locations in the bad block log and a corresponding location of a replacement block ("replacement block location") for each bad block location. Data is stored in each replacement block instead of the corresponding bad block. The start-up operation includes making operational a controller for the solid-state storage from a non-operational state. Creating the bad block map includes using one of a replacement block location stored with each bad block location in each of the bad block logs and a bad block mapping algorithm that uses a storage order of the bad block locations in a bad block log to pair each bad block location with a replacement block location.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
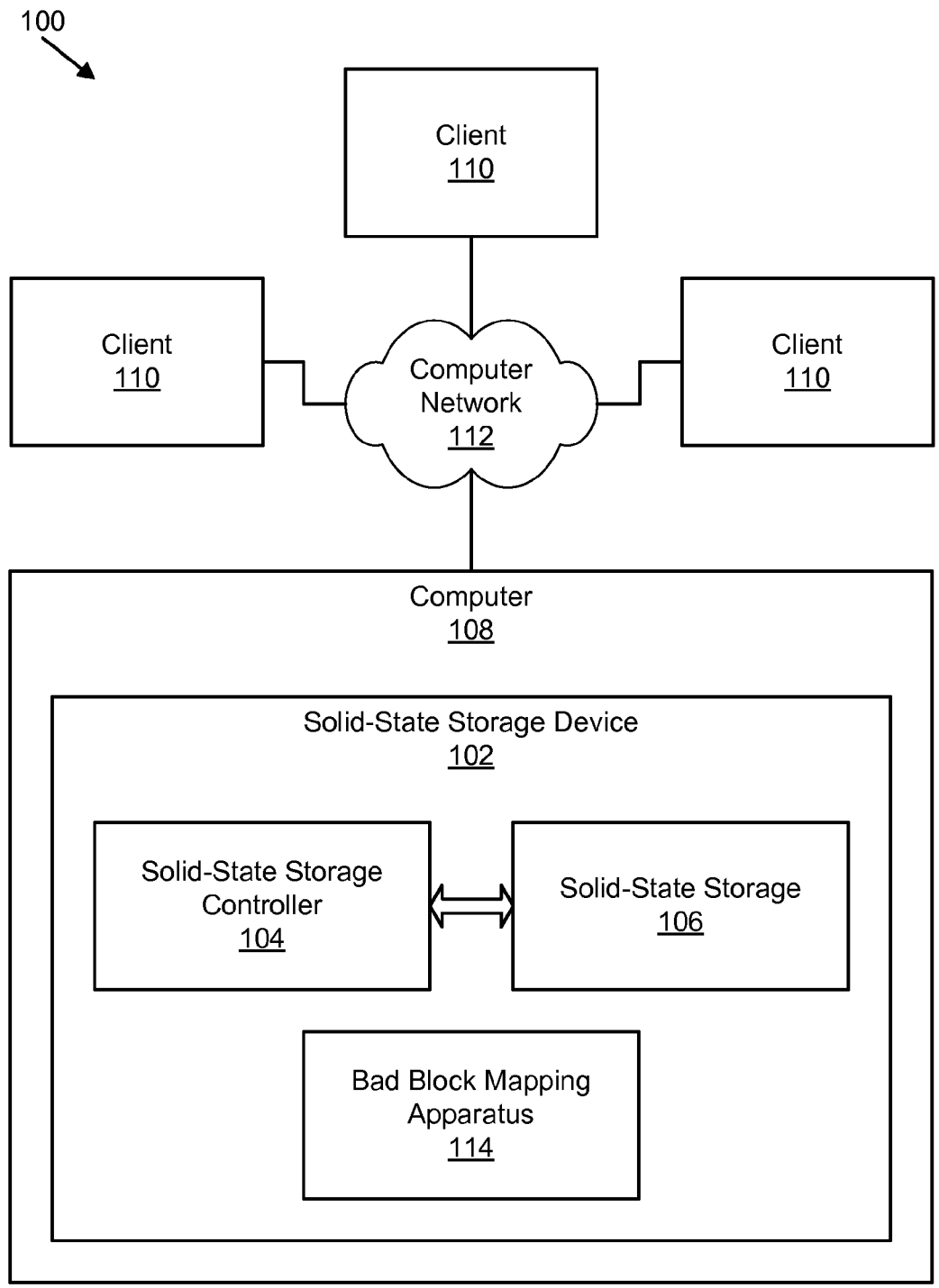
FIG. 1 is a schematic block diagram illustrating one embodiment of a system for mapping bad blocks in solid-state storage in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

In solid state storage, such as flash, it is not uncommon for arrays of memory to come from the factory with bad blocks. It is common practice for the first page of each erase block in these devices to come with bad block information for the array (hereafter, "block" is equivalent to "erase block"). While vendors usually guarantee that block zero is good, we have found this to sometimes not be the case. The cost of rework is sufficiently high that it is desirable to continue to operate the device when block zero is found bad or goes bad during the life of the product.

During the manufacturing process, we have found it to be good practice to read and store this bad block information for the entire array of chips within a solid state storage device, and then scrub the entire device to verify that there are no additional bad blocks. Then typically the bad block information from the factory is merged with the bad block data identified during the scrubbing process and programmed back into the device. The bad block information is typically stored in a consolidated format, which may be a table. This consolidated bad block table is typically more efficient to use and maintain than having bad block data spread out. This consolidated bad block data structure has an additional benefit of returning pages reserved for bad block information to be used to increase capacity for later bad block information.

The storage device typically maintains a table or other data structure of LEB (Logical Erase Block) to PEB (Physical Erase Block) mappings. This enables higher layers of software controlling and accessing the solid-state storage to address LEBs directly typically without concern for the underlying PEB layout, even given the fact that numerous PEBs may have failed on typical NAND parts. Because this information must be persistent, in one embodiment, this information is redundantly stored in non-volatile memory in two or more distinct erase blocks. In addition, the bad block information is preferably protected with a robust error correcting code ("ECC") and may also be protected using a spare chip or die in a scheme where that data in a bad block can be recovered.

Bad block information, which includes a bad block location, is often stored as tuples comprising the die and bad erase block, although it may be stored as an address, or other way that indicates location. When additional blocks fail during operation of the part, information regarding the additional bad block location is typically appended to a list, map, etc. of bad blocks.

Since this bad block location data is critical to the operation of the device, and the loss of the bad block information might cause future operation of the solid-state storage device to lose and/or corrupt data, it is advisable to store multiple copies of the bad block data. Storing multiple copies of the bad block data has an additional benefit of increasing the probability that a failure to program one block containing the bad block information with one or more additional tuples or other form of bad block location data does not risk loss of the bad block data. It is preferable to store the redundant information in separate erase blocks, and more preferable yet to store the redundant bad block data in an entirely separate area of the non-volatile storage as compared to storing multiple instances of the bad block data in adjacent cells.

Another means to reduce the probability of failure of the blocks containing the bad block location data is to reduce the wear on these blocks. In one embodiment, this is done by programming one or more new failed block locations into a next available page. While this may be seen as a waste of space, saving additional bad block locations in a next available page avoids having to do multiple page programs—which typically should be avoided due to the negative impacts to the reliability of the data. Saving additional bad block locations in a next available page also avoids having to read out bad block locations from the block storing the bad block data, erase the block storing the bad block data, merge the new bad block location data into the list of bad blocks, and then program the list back to the block storing the bad block data. While such a process might have limited negative impact on the life of the part, more importantly, it is not time efficient.

During a scrubbing process, for example when a die is received from a factory, two or more erase blocks are typically identified to hold the bad block data. These blocks are typically uniquely identified with a specific erase block header stored within the blocks. While block zero would usually be one of these, this need not be the case. These blocks for storing bad block data may be taken from a predetermined pool of blocks that is a minor subset of a total number of blocks in a solid-state storage array. This facilitates finding the blocks storing bad block data immediately following the reset of the solid-state storage device. Said differently, whereas the controller for the solid-state storage must access these blocks in order to build a bad block remap table, which is typically needed in advance of accessing any data on the device, it is typically requisite to first scan the solid-state storage device and identify these blocks storing bad block data and load the bad block information into the bad block remap table in whatever form that may take.

To further reduce the time needed to identify these blocks storing bad block data, each of the blocks may additionally include the address of the one or more redundant blocks containing bad block data. This has additional benefit of helping to validate that the correct blocks storing bad block data have been identified.

As mentioned previously, new bad block tuples or bad block locations are programmed into a next available empty page. At a prescribed point, when the device is close to running out of pages to append additional tuples, has reached a threshold of number of pages with bad block data, or some other trigger, one of the blocks may be erased, the tuples or bad block locations consolidated, and the bad block list, map, or other structure is written back into the block with bad block data along with header information and the one or more peer block identifiers. A peer block is an additional block that stores redundant bad block data. Once completed, the other blocks can be erased and consolidated.

In the event that there is a power outage while one of these blocks is being updated, in one embodiment the solid-state storage controller will be able to identify the block with the most bad block data as the most current copy. The process of completing updates of the one or more peer blocks then takes place.

The bad block remapping tables or other data structure with bad block data used by the controller, in one embodiment, are built from the list of bad blocks through a predetermined bad block mapping algorithm that deterministically remaps the bad blocks per the order of the tuples or bad block locations in the list. In this embodiment, it is important therefore that the list of tuples not be reordered. Generally these bad block tables are maintained in random access memory ("RAM"). Generally, these bad block tables are not stored in non-volatile memory, due to size constraints, and the fact that they can be efficiently reconstructed from a bad block log. A bad block log comprises bad block location data and other data, such as corresponding replacement block, stored in a block of a known location. This scheme uses a relatively low amount of non-volatile memory capacity to store the bad block list and the implicit bad block remapping.

In one embodiment, other data may be stored with bad block data. For a newly identified bad block, for example, a time indicator may be stored. A time indicator is typically some indicator of time or sequence that ties bad block identification with a time or sequence. For example, the time indicator may be a timestamp, a value from a block sequence counter, or the like. Storage of a time indicator, among other benefits, enables tracking of a rate at which bad blocks are identified, which may help determine a rate of wear out and expected life of the solid-state storage. In addition, other data may also be stored with bad block data, such as error data indicating an error type or some other indication of error associated with identification of the bad block.

In another embodiment, the bad block tuples or locations are stored along with replacement block data such a replacement block location. This might be done to enable hardware to access the bad block mapping without having to execute the bad block mapping algorithm. In this case, the tuples might be reordered. Here, the order might be maintained so that a scrubber might read the list and validate that the remapping is consistent. A scrubber might additionally validate the bad block data by comparing the blocks containing the bad block data.

As implied above, generally, the bad block remap table or data structure will be loaded into RAM, for fast access. The previously mentioned schemes for identifying the bad blocks and the remapping of the bad blocks are typically loaded into the RAM during device initialization or other instance when the bad block map is corrupted or lost. In one embodiment, bad block information stored in RAM differs from how the same bad block information is stored in non-volatile memory. In another embodiment, bad block information is stored in RAM in a same format as the bad block information is stored in non-volatile memory.

If one of the blocks fails during the life of the product, another block is selected from the previously mentioned pool of blocks set aside for bad block data, and the data is copied from the at least one peer (redundant bad block log) to the new block. The new block is initialized with header information and peer address information. The peers are then updated with the information of the new block with the bad block log, such as the address of the new block. In one embodiment, each peer block is erased and updated, and typically bad block information is consolidated before being stored back to a peer block. In a preferred embodiment, bad block information from a peer block is also stored in a consolidated form to the new, replacement block storing bad block information. In a preferred embodiment, a record of the change is written into the next available page within the block with bad block data. This embodiment typically requires any code attempting to determine a peer to read the entire block to ensure that the peer information in the first page of the block is not stale.

FIG. 1 is a schematic block diagram illustrating one embodiment of a system 100 for mapping bad blocks in solid-state storage 106 in accordance with the present invention. The system 100 includes a solid-state storage device 102 with a solid-state controller 104 and solid-state storage 106. In one embodiment, the solid-state storage device 102 is in a computer 108 connected to one or more clients 110 through a computer network 112. The system 100 includes a bad block mapping apparatus 114. The components of the system 100 are described below.

The system 100 includes at least one solid-state storage device 102. In another embodiment, the system 100 includes two or more solid-state storage devices 102. Each solid-state storage device 102 may include non-volatile, solid-state storage 106, such as flash memory, nano random access memory ("nano RAM or NRAM"), magneto-resistive RAM ("MRAM"), dynamic RAM ("DRAM"), phase change RAM ("PRAM"), etc. The solid-state storage device 102 is depicted in a computer 108 connected to a client 110 through a computer network 112. In one embodiment, the solid-state storage device 102 is internal to the computer 108 and is connected using a system bus, such as a peripheral component interconnect express ("PCI-e") bus, a Serial Advanced Technology Attachment ("serial ATA") bus, or the like.

In another embodiment, the solid-state storage device 102 is external to the computer 108 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 108 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline and a read data pipeline and each includes a solid-state storage 106. The solid-state storage 106 comprises two or more solid-state storage elements, such as a solid-state storage chip or die. The solid-state storage 106 may be arranged with multiple solid-state storage elements in a bank and may have two or more banks. The solid-state storage 106, write data pipeline, read data pipeline, and other relevant components is described in detail in U.S. patent application Ser. No. 11/952,091 to David Flynn, et al., titled "Apparatus, System, and Method for Managing Data Using a Data Pipeline," filed Dec. 6, 2007, which is hereinafter incorporated by reference.

The system 100 includes one or more computers 108 connected to the solid-state storage device 102. A computer 108 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 108 may be a client and the solid-state storage device 102 operates autonomously to service data requests sent from the computer 108. In this embodiment, the computer 108 and solid-state storage device 102 may be connected using a computer network, system bus, or other communication means suitable for connection between a computer 108 and an autonomous solid-state storage device 102. One of skill in the art will recognize other forms of a computer 108 and ways to connect the solid-device 108 through a computer network or bus.

In one embodiment, the system 100 includes one or more clients 110 connected to one or more computer 108 through one or more computer networks 112. A client 110 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 112 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 112 may also include a network from the IEEE 802 family of network technologies, such Ethernet, token ring, WiFi, WiMax, and the like. One of skill in the art will recognize other forms of a client 110 and other computer networks 112.

The computer network 112 may include servers, switches, routers, cabling, radios, and other equipment used to facilitate networking computers 108 and clients 110. In one embodiment, the system 100 includes multiple computers 108 that communicate as peers over a computer network 112. In another embodiment, the system 100 includes multiple solid-state storage devices 102 that communicate as peers over a computer network 112. One of skill in the art will recognize other computer networks 112 comprising one or more computer networks 112 and related equipment with single or redundant connection between one or more clients 110 or other computer with one or more solid-state storage devices 102 or one or more solid-state storage devices 102 connected to one or more computers 108. In one embodiment, the system 100 includes two or more solid-state storage devices 102 connected through the computer network 118 to a client 112 without a computer 108.

The system 100 includes a bad block mapping apparatus 114. The bad block mapping apparatus 114 is depicted in FIG. 1 in the solid-state storage device 104, but may be in the solid-state controller 104, solid-state storage 106, computer 108, etc. The bad block mapping apparatus 114 may be located together or distributed. One of skill in the art will recognize other forms of a bad block mapping apparatus 114. The bad block mapping apparatus 114 is described in more detail below.

Figure 2:
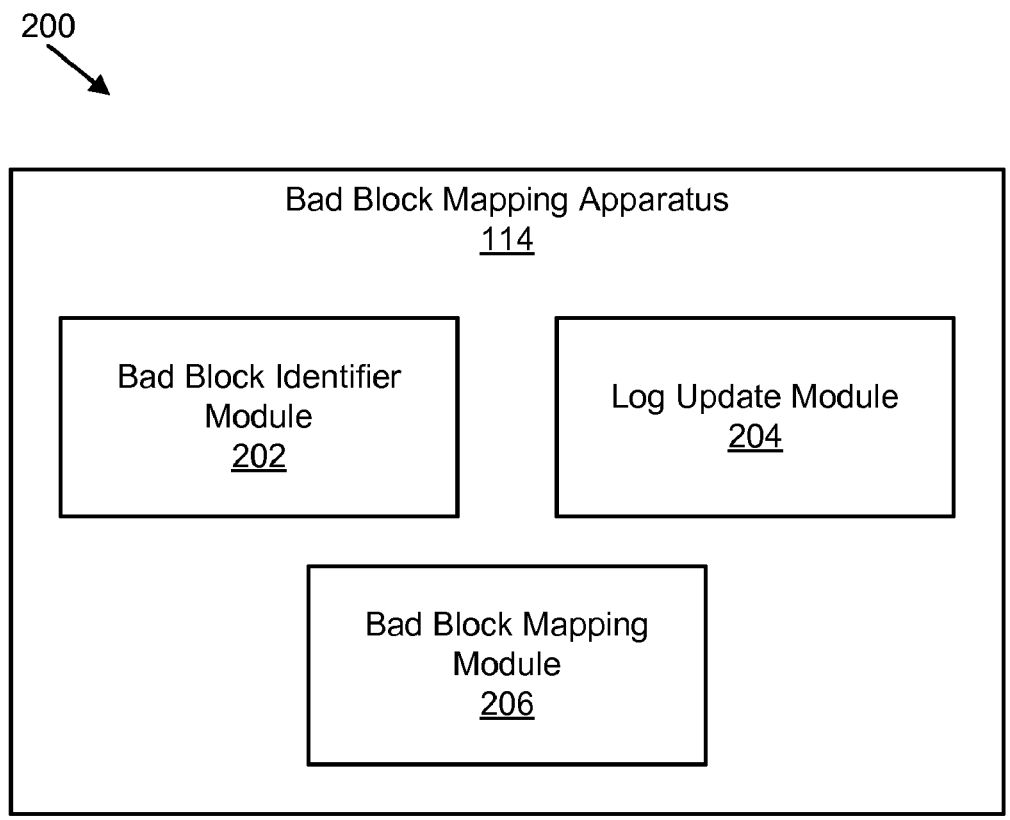
FIG. 2 is a schematic block diagram illustrating one embodiment of an apparatus for mapping bad blocks in solid-state storage in accordance with the present invention.

FIG. 2 is a schematic block diagram illustrating one embodiment of an apparatus 200 for mapping bad blocks in solid-state storage 106 in accordance with the present invention. The apparatus 200 includes one embodiment, of the bad block mapping apparatus 114 and includes, in one embodiment, a bad block identifier module 202, a log update module 204, and a bad block mapping module 206, which are described below.

In one embodiment, apparatus 200 includes a bad block identifier module 202 that identifies one or more data blocks as bad blocks. Each bad block is located on a solid-state storage element in an array of solid-state storage elements 106. Each data block, and hence bad block, typically is a physical block. In one embodiment, a physical block is a physical erase block ("PEB"). An erase block is typically a block that is erased in an erase operation. In another embodiment, a physical block is not an erase block, but is independent of a unit of storage erased in an erase operation. A physical erase block is typically an erase block located on one die, chip, or other solid-state storage element that comprises an element of the solid-state storage array. (The solid-state storage array is shown in FIG. 1 as the solid-state storage 106 and the terms may be used interchangeably herein).

A PEB typically includes multiple pages and a page is typically a group of bytes that are programmed together. In one embodiment, a group of PEBs forms a logical erase block ("LEB"). A page in each PEB may form a logical page and a logical page may be programmed together. For example, a write buffer, when filled, may be written to a logical page. In a preferred embodiment, a logical page is protected together with ECC and forms an ECC chunk. In one embodiment, an ECC chunk may be arranged to protect a bad block log as well as other data. While an array of solid-state storage elements is preferred, it is contemplated that the invention described herein also applies to a solid-state storage element and therefore "block" may include a single block or a logical block. For example, a bad block is typically a bad PEB while a block storing bad block data is typically a logical block spanning multiple solid-state storage elements.

Each bad block is a block determined to be inappropriate for data storage. For example, a bad block may include a page or other portion of the block that has failed in some way. For example, a bad block may include bits that are stuck, a faulty address line, a faulty page selection line, etc. or a number of errors above a threshold. The errors may be recoverable errors or non-recoverable errors. In one embodiment, the bad block identifier module 202 receives information from a die or chip that an erase or a program has not completed correctly, which is interpreted as an indication of a bad block. This indication is a common signal available on NAND flash devices.

For example a bad block may be a block with one or more non-recoverable errors. A non-recoverable error may include an error that is not correctable using ECC protecting data in the bad block. One of skill in the art will recognize other ways to determine a non-recoverable error. In another embodiment, the bad block identifier module 202 may identify a bad block using a scrubbing process, device initialization, error checking, or other way to find a bad block that will not function properly to reliably store data.

In one embodiment, a bad block may be a block may be functional but that has an increased number of correctable errors. For example, a bad block may be a block with a number of correctable errors above a threshold. In another example, a bad block may be a block with a high number of reads or writes. One of skill in the art will recognize other ways to determine if a bad block is no longer suitable for storing data. The bad block identifier 202 may include any method that identifies a block that is not suitable for storing data.

In one embodiment, the apparatus 200 includes a log update module 204 that writes at least a location of each bad block ("bad block location") identified by the bad block identifier module 202 into each of two or more redundant bad block logs. As mentioned above, a bad block log is a location in a block that includes bad block data. A bad block log may be a tuple, a table, a data field, or other data structure that allows a bad block location and any other relevant data, such as a replacement block location to be stored in a designated block. Typically, the bad block log is stored in a logical block spanning a bank of solid-state storage elements in the solid-state storage 106 and protected by ECC for each a logical page in the logical block. In one embodiment, the logical block storing the bad block data may span all banks. In another embodiment, this same logical block may span all channels.

For at least one of the bad block logs (and typically all of the bad block logs), the log update module 204 writes the one or more bad block locations into a page of a block comprising the bad block log where the page does not have previously written bad block location information. As stated above, by writing the one or more new bad block locations of bad blocks identified by the bad block identifier module 202, recording the bad block data is more efficient and is faster than reading the bad block log, modifying the bad block data stored in the bad block log, erasing the pages storing the bad block data, and then writing the updated bad block data back to block designated to store the bad block log. It is also faster than modifying the bad block data and then storing the modified bad block data into the next available page within the erase block.

Writing updated bad block data to a new page offers significant advantages over conventional bad block management methods. In one embodiment, when a bad block is identified, the bad block location and other pertinent data that may be used to update a bad block map is configured as a delta file that includes a difference between an updated version of the bad block map and a version of the bad block map before the update. The log update module 204, in this embodiment, stores the delta file in a new page. Writing bad block data to a new page and subsequent compaction will be described in more detail with respect to FIG. 3.

In one embodiment, the bad block mapping apparatus 114 includes a bad block mapping module 206 that accesses at least one bad block log during a start-up operation to create in memory a bad block map. The bad block map includes a mapping between the bad block locations in the bad block log and a corresponding location of a replacement block ("replacement block location") for each bad block location. Data is stored in each replacement block instead of the corresponding bad block.

Typically a replacement block is a physical block or PEB within a retired logical block or retired LEB. In one embodiment a retired logical block has two or more physical blocks where at least one physical block is a bad block determined to be bad at a previous time, thus making available physical blocks in the logical block other than the bad block to be used as a replacement block. In another embodiment, a logical block that is in a pool of logical blocks available for data storage is retired, thus making available all of the physical blocks in the logical block to become replacement blocks.

The start-up operation includes making operational the solid-state storage controller 104 from a non-operational state. The start-up operation may include starting up the solid-state storage controller 104 when power is applied, when resuming operation after being in a low-power state, after a reset, etc. The start-up operation includes any circumstance where the bad block map must be stored in memory. Such a circumstance includes any state where the memory is corrupted or lost. The memory is typically RAM and may include any level of cache. One of skill in the art will recognize when the bad block map must be created in memory.

There are multiple ways that the bad block mapping module 206 may create the bad block map. For example in a preferred embodiment, a replacement block location is stored with a corresponding bad block location in one or more bad block logs. Typically a replacement block chosen to replace a bad block is a different physical block than the bad block but the replacement block is typically within the same die or chip. Selecting a replacement block on a same die or chip as a bad block is preferred over selection of a replacement block in another die, chip, bank, etc. because a more complicated address scheme would typically be required, such as multiplexing ("MUXing"). In this embodiment, the bad block mapping module 206 may create the bad block map using the replacement block location stored with each bad block location. In this embodiment, the order of storage of the bad block locations may not be required to build the bad block map but may instead be useful for determining consistency between the bad block logs.

In another embodiment, the bad block map is stored in one or more of the bad block logs and the bad block mapping module 206 may build the bad block map by reading a bad block log. In another embodiment bad block locations are stored in a particular order in the bad block logs and the bad block mapping module creates a bad block map using a bad block mapping algorithm that uses a storage order of the bad block locations in a bad block log to pair each bad block location with a replacement block location. For example, the bad block mapping algorithm may, in this embodiment, pair a first bad block location with a first replacement block, the second bad block location with a second replacement block, etc. where the replacement block locations and order are determined algorithmically. In one embodiment, the bad block map differs from bad block data stored in a bad block log.

In one embodiment, a bad block data may be stored as a bit map, which typically may be a sparse bit map. This sparse bit map might be coupled with a corresponding replacement map to allow for more compact, and rapid lookup of bad block data. One of skill in the art will recognize other ways that the bad block mapping module 206 may create a bad block map from bad block location stored in a bad block log.

Typically the bad block mapping module 206 accesses at least one bad block log by accessing the block comprising the bad block log at a known physical location within the solid-state storage array 106. Having the bad block log in a block with a known physical location allows a bios or other startup code to access the bad block log with a simple direct address. The known physical location may be a first block, a last block, a block of a predetermined number, a block at a known offset into the solid-state storage array, etc.

Figure 3:
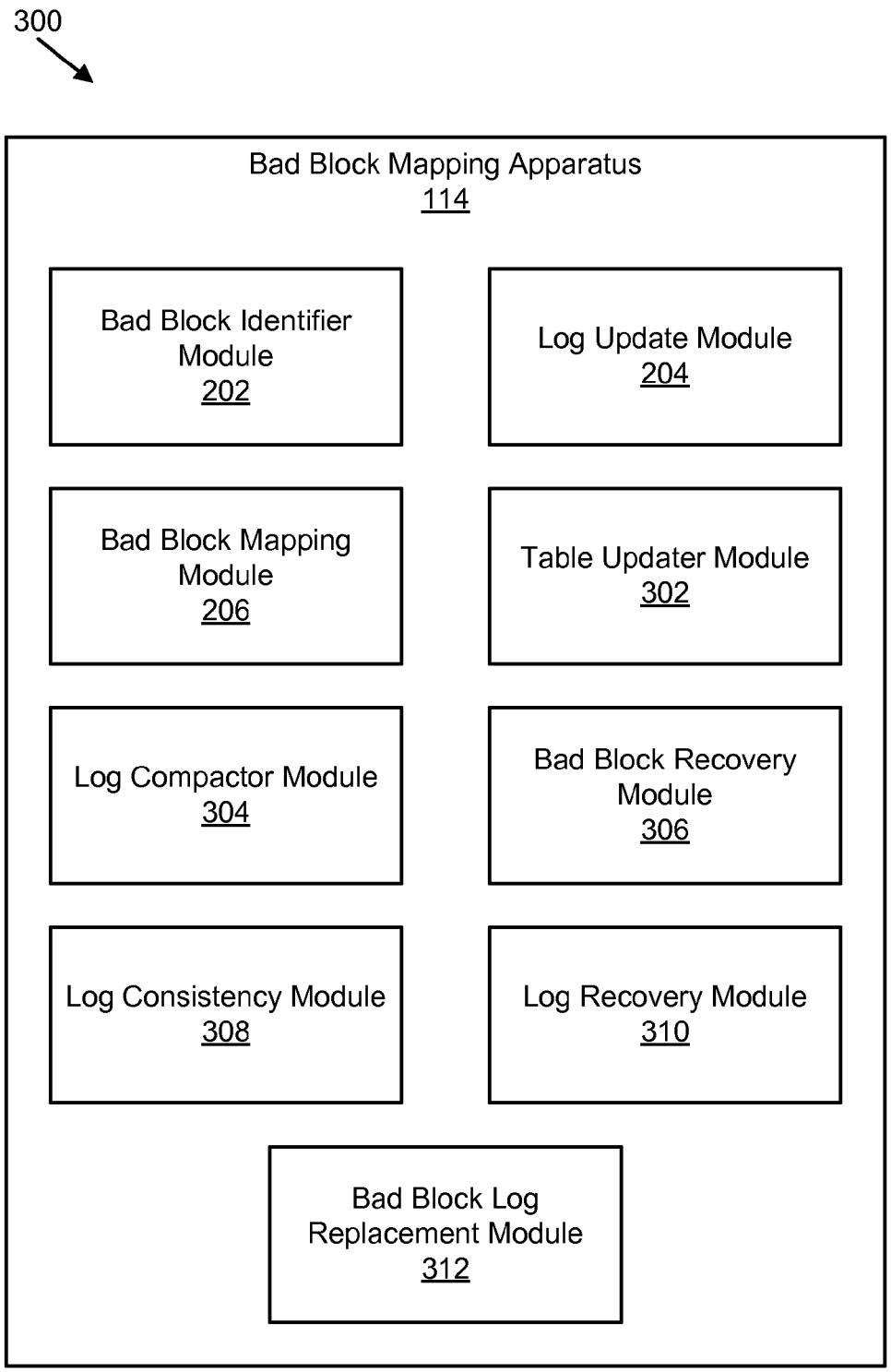
FIG. 3 is a schematic block diagram illustrating another embodiment of an apparatus for mapping bad blocks in solid-state storage in accordance with the present invention.

FIG. 3 is a schematic block diagram illustrating another embodiment of an apparatus 300 for mapping bad blocks in solid-state storage 106 in accordance with the present invention. The apparatus 300 includes an alternate bad block mapping apparatus 114 with a bad block identifier module 202, a log update module 204, and a bad block mapping module 206, which are substantially similar to those described with respect to the apparatus 200 in FIG. 2. The apparatus 300, in various embodiments, may also include a table updater module 302, a log compactor module 304, a bad block recovery module 306, a log consistency module 308, a log recovery module 310, and a bad block log replacement module 312, which are described below.

The apparatus 300, in one embodiment, includes a table updater module 302 that updates the bad block map by mapping a replacement block location to a bad block location and then storing the mapping in the bad block map. Typically the table updater module 302 updates the bad block map after the bad block identifier module 202 identifies a bad block. In one embodiment, the table updater module 302 starts with an empty bad block map and updates the bad block map with factory bad block locations. The table updater module 302 may then add to the bad block map during a scrubbing operation where storage locations in the solid-state storage 106 are tested. In another embodiment, the table updater module 302 updates the bad block map after a failure of at least a portion of a bad block and the bad block identifier module 202 identifies the failed bad block. One of skill in the art will recognize other times when the table updater module 302 may update the bad block map.

The bad block map may be a table, a linked list, or other data structure that allows bad block locations to be paired with replacement block locations. The bad block map may be stand alone structure or may be part of a logical-to-physical map or other data structure. One of skill in the art will recognize other ways to structure a bad block map.

In another embodiment, the apparatus 300 includes a log compactor module 304. Typically the log compactor module consolidates bad block locations and related data in various pages in a bad block log. In one embodiment the log compactor module 304 reads a block comprising a bad block log and reads each subsequent page storing one or more bad block locations. If the log update module 204 stores bad block locations in a new page each time the bad block identifier module 202 identifies a bad block, each page may be sparsely populated with bad block data. The log update module 204 may also store other system information that may be used at a later time by management. For example, the log update module 204 may store a time stamp, an error code, etc.

In the embodiment, the log compactor module 304 typically erases the pages storing bad block locations and stores at least the bad block locations read from the pages together into one or more pages in the block comprising the bad block log ("compacted bad block pages"). In a typical embodiment, the pages with bad block data are logical pages. The log compactor module 304 erases the bad block data before storage to prevent possible conflicts with the compacted bad block data stored back to the block with the bad block log.

Typically the block with the bad block log includes 64 pages and when bad block data is compacted, it will fit in a single logical page. Subsequent bad block location are then stored each in a new page. As the block fills again with pages with bad block data, the log compactor module 304 may again compact the bad block data in a first page where compacted bad block data was previously stored or in a second logical page. This process may then repeat.

In another embodiment, the log compactor module 304 erases pages storing bad block locations and stores the bad block map in one or more pages of the block comprising the bad block log. The log compactor module 304 stores the bad block map as one or more compacted bad block pages. Subsequently the log update module 204 stores additional bad block locations in new pages as with the example above and the log compactor module 304 may again at some point store the bad block map in the bad block log and then start the process over again.

The log compactor module 304 may compact the bad block log when the block is full of pages with bad block data, may compact the bad block log when reaching a threshold of number of pages with bad block location information, or some other triggering action known to those of skill in the art. The log compactor module 304 may also consolidate other data stored in conjunction with the bad block map into respective logs or cause the information to be communicated to an external management system. For example, management data would be consolidated into a management log simultaneously to the consolidation of the bad block log.

In another embodiment, the apparatus 300 includes a bad block recovery module 306 that recovers valid data stored in an identified bad block and stores the data in a replacement block mapped to the bad block. The bad block recovery module 306 may recover the valid data in any number of ways. In one example, if the identified bad block is still functioning, but is merely demonstrating degraded operation, is experiencing recoverable errors, the bad block recovery module 306 may recover the data directly from the bad block. In another embodiment, the valid data in the bad block may be unavailable so the bad block recovery module 306 may use ECC to correct data read from the bad block, may read valid data derived from a spare chip or die, may recreate the valid data stored in a stripe of a redundant array of independent drives ("RAID"), may read data from a mirror, or may use another data recovery method.

The apparatus 300, in one embodiment, includes a log consistency module 308 that compares the two or more bad block logs and, if available, the bad block map and determines if the bad block logs and bad block map are consistent. Typically the bad block map and bad block logs are consistent if they all reflect the same bad block data even if in different forms. If one of the bad block logs or the bad block map is inconsistent, in a preferred embodiment a voting scheme may be used and two or more of the total number of bad block logs or the bad block map that are correct may be used to fix the inconsistent log or map. Typically a bad block log or a bad block map that is determined to be correct can be used to correct an inconsistent bad block log or map.

In a simple example if power is lost or some similar event occurs while the log update module 204 is updating a bad block log or the bad block mapping module 206 is updating the bad block map, the number of bad block locations in each of the bad block logs and bad block may be different, which typically indicates an inconsistency. In this case, the log consistency module 308 may determine that a log is inconsistent if it has less bad block locations than other bad block logs or the bad block map and the bad block logs or map that has the most bad block locations can be used to update the bad block logs or map that are inconsistent. However, if the bad block logs or map with more bad block locations is determined to have an error through ECC checking or other means, then the bad block log or map may still be inconsistent.

The log consistency module 308 may determine consistency based on a number of triggering events, such as detecting an error while updating one or more of the bad block logs, the bad block mapping module 206 creating the bad block map during a start-up operation, after an interruption while updating the two or more bad block logs, after determining that ECC cannot correct errors in data, in response to a periodic scrubbing operation, expiration of a period of time, as commanded by a user, etc. One of skill in the art will recognize other ways that the log consistency module 308 may commence checking of consistency of bad block logs and/or a bad block map.

In one embodiment, the apparatus 300 includes a bad block log replacement module 312 that corrects a situation where a bad block log is in a block that is defective, is unreadable, has failed, is about to fail, etc. The bad block log replacement module 312 first determines that a block that includes a bad block log is in a condition to be replaced. The bad block log replacement module 312 then selects a block within a pool of blocks designated for bad block data storage and the writes bad block data into the selected block that is consistent with another bad block log and/or the bad block map. Having a designated pool of blocks designated to store bad block logs is advantageous because the designated blocks may remain unused until designated to store bad block data, thus reducing wear and increasing reliability.

Figure 4:
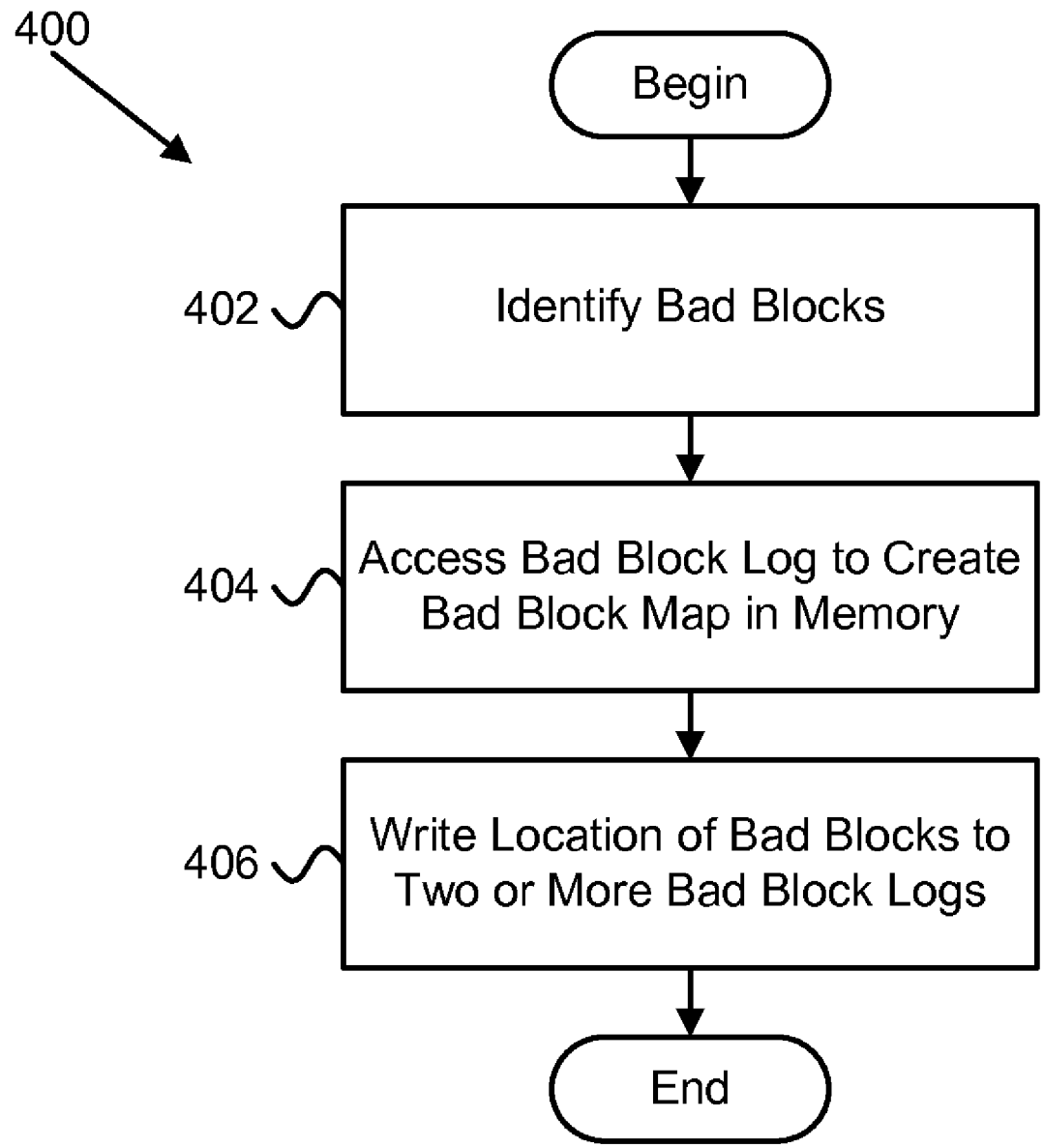
FIG. 4 is a schematic flow chart diagram illustrating one embodiment of a method for mapping bad blocks in solid-state storage in accordance with the present invention.

FIG. 4 is a schematic flow chart diagram illustrating one embodiment of a method 400 for mapping bad blocks in solid-state storage 106 in accordance with the present invention. The method 400 begins and the bad block identifier module 202 identifies 402 one or more data blocks as bad blocks. This may occur by reading factory bad block data, during a scrubbing operation, during normal operation of the solid-state storage 106 when a block fails, has errors, has a high number of reads, etc., or other situation where a bad block may be identified.

The bad block mapping module 206 accesses 404 at least one bad block log during a start-up operation to create a bad block map in memory. The bad block map includes a mapping between the bad block locations in the bad block log and a corresponding location of a replacement block for each bad block location. Data is stored in each replacement block instead of the corresponding bad block.

The log update module 204 writes 406 at least a location of each bad block identified by the bad block identifier module 202 into each of two or more redundant bad block logs and the method 400 ends. Typically the bad block location is stored in a new page in each block containing a bad block log. The log update module 204 may write 406 bad block data into a bad block log during a scrubbing operation, normal operation, and the like.

Figure 5:
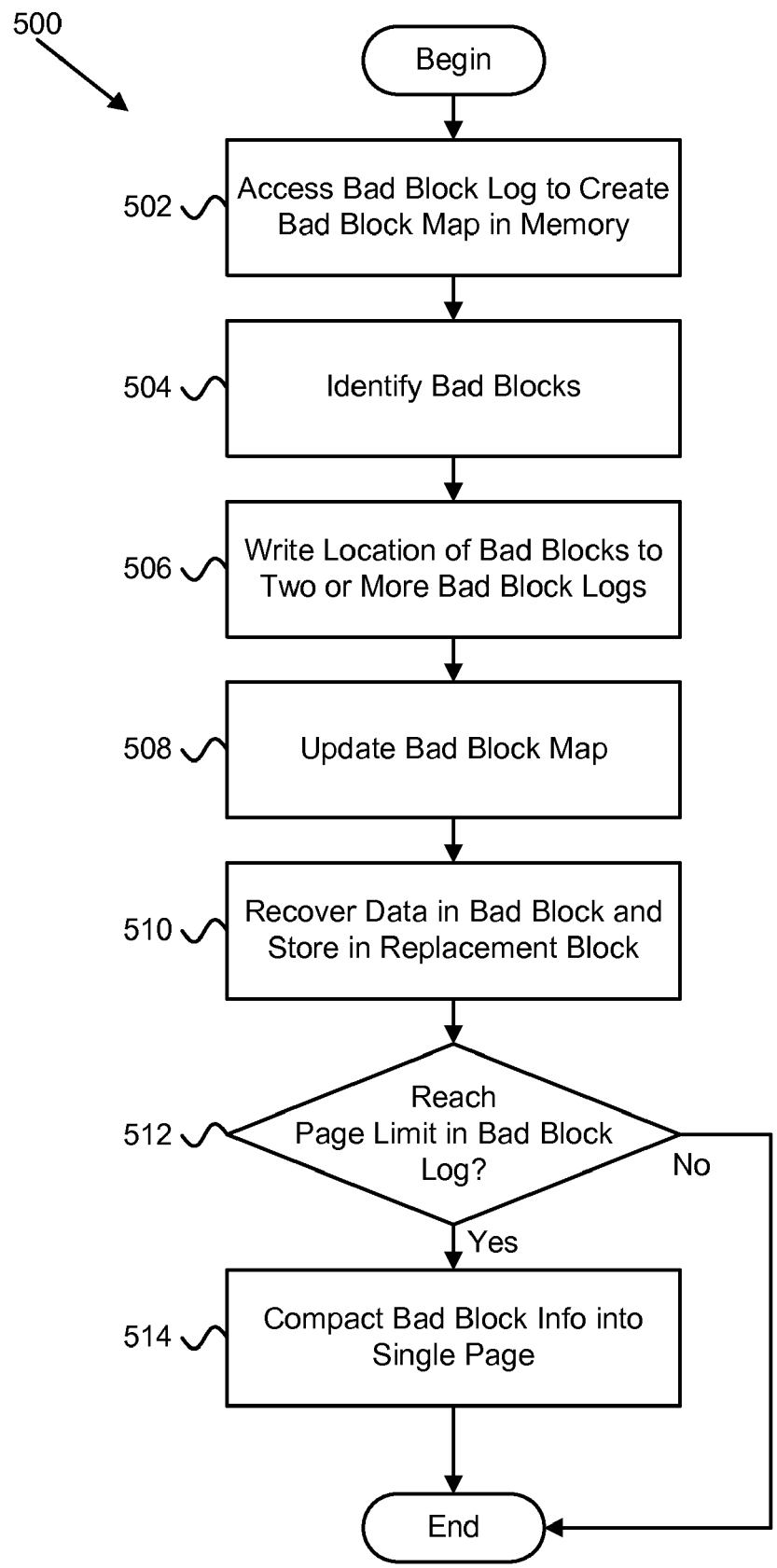
FIG. 5 is a schematic flow chart diagram illustrating another embodiment of a method for mapping bad blocks in solid-state storage in accordance with the present invention.

FIG. 5 is a schematic flow chart diagram illustrating another embodiment of a method 500 for mapping bad blocks in solid-state storage in accordance with the present invention. The method 500 begins and the bad block mapping module 206 accesses 502 at least one bad block log during a start-up operation to create a bad block map in memory. This may occur after a reset, during a scrubbing operation, etc.

The bad block identifier module 202 identifies 504 one or more data blocks as bad blocks and the log update module 204 writes 506 at least a location of each bad block identified by the bad block identifier module 202 into each of two or more redundant bad block logs in a new page. The table updater module 306 updates 508 the bad block map in memory with the new bad block location identified 504 by the bad block identifier module 202.

The bad block recovery module 306 recovers 510 valid data stored in the bad block using ECC, RAID, a mirror, etc. and stores 510 the valid data in the replacement block. The log compaction module 304 determines 512 if a page limit in the block comprising the bad block log has been reached. If the log compaction module 304 determines 512 that a page limit in the block comprising the bad block log has been reached, the log compaction module 304 reads the bad block log, erases the bad block data in the bad block log, and compacts 514 bad block location data and other data into a single page, and the method 500 ends. If the log compaction module 304 determines 512 that a page limit in the block comprising the bad block log has not been reached, the method 500 ends.

Note that the steps of the method are only one embodiment and one or more of the steps may occur during a scrubbing operation, a factory startup operation, startup, normal operation, etc. The steps may occur in any order and FIG. 5 merely depicts one order of operation.

Figure 6:
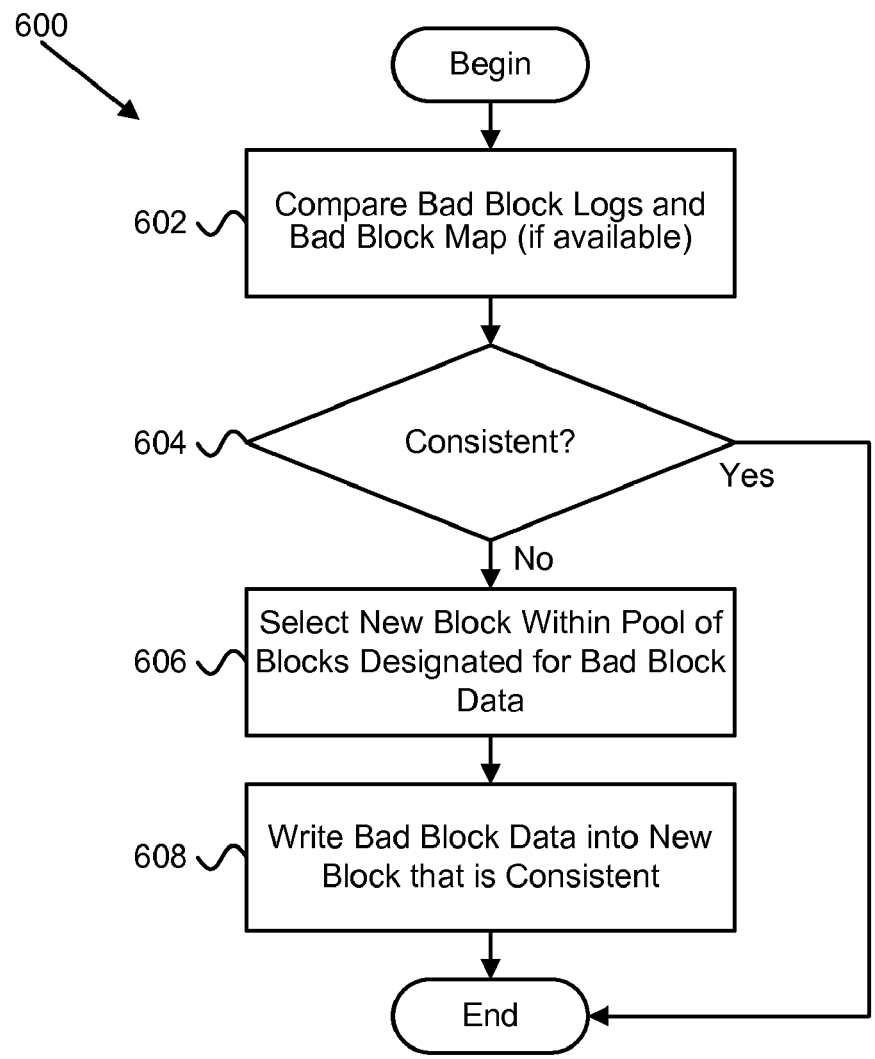
FIG. 6 is a schematic flow chart diagram illustrating one embodiment of a method for detecting and replacing a bad block log in solid-state storage in accordance with the present invention.

FIG. 6 is a schematic flow chart diagram illustrating one embodiment of a method 600 for detecting and replacing a bad block log in solid-state storage in accordance with the present invention. The method 600 begins and the log consistency module 308 compares 602 bad block logs and the bad block map, if the map is available, to determine 604 if the bad block logs and map are consistent. If the log consistency module 308 determines 604 that the bad block logs and map are consistent, the method 600 ends.

In this particular embodiment, determining 604 that a bad block log is inconsistent signifies that the block containing the bad block log has failed or is otherwise non-operational. In this case, the bad block log replacement module 312 selects 608 a block within a pool of blocks designated for bad block data storage. In another embodiment, the bad block log may be inconsistent for another reason, such as a power outage while the bad block log was being updated, so step 606 is skipped. The log recovery module 310 uses data from a bad block log that is determined to be correct or the bad block map that is determined to be correct and writes 608 correct bad block data into the bad block log and the method 600 ends.

Figure 7:
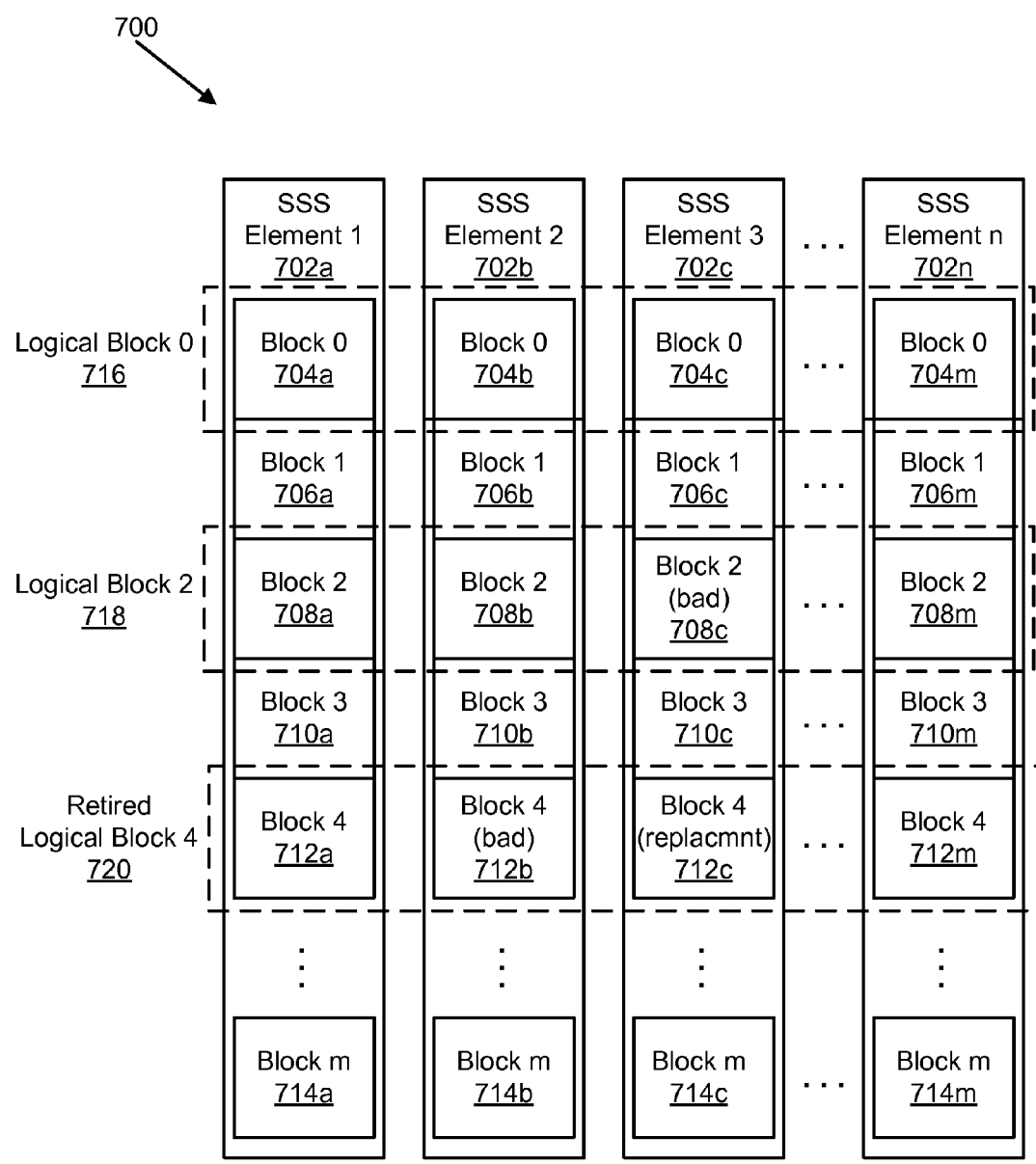
FIG. 7 is a schematic block diagram illustrating one embodiment of an array of solid-state storage devices depicting blocks in the array in accordance with the present invention.

FIG. 7 is a schematic block diagram illustrating one embodiment 700 of an array of solid-state storage devices 106 depicting blocks in the array in accordance with the present invention. The solid-state storage array 106 includes several solid-state storage elements 702a, 702b, . . . 702n. Each solid state storage element 702 includes m blocks. For example solid-state storage element 1 702a includes block 0 704a, block 1 706b, block 2 708a, block 3 710a, block 4 712a, . . . block m 714 m. Logical block 0 716 includes each block 0 704 from each solid-state storage element 702. Logical block 0 716 may be designated for bad block data storage.

In this example, logical block 2 718 has a failure in physical block 2 708c in solid-state storage element 3 702c. Logical block 4 720, in this embodiment, was used for storing data and experienced a failure in physical block 4 712b within solid-state storage element 2 702b and is designated as a retired block. The physical block 4 712c in solid-state storage element 3 702c may then be used as a replacement block for bad physical block 2 708c in solid-state storage element 3 702c.

Figure 8:
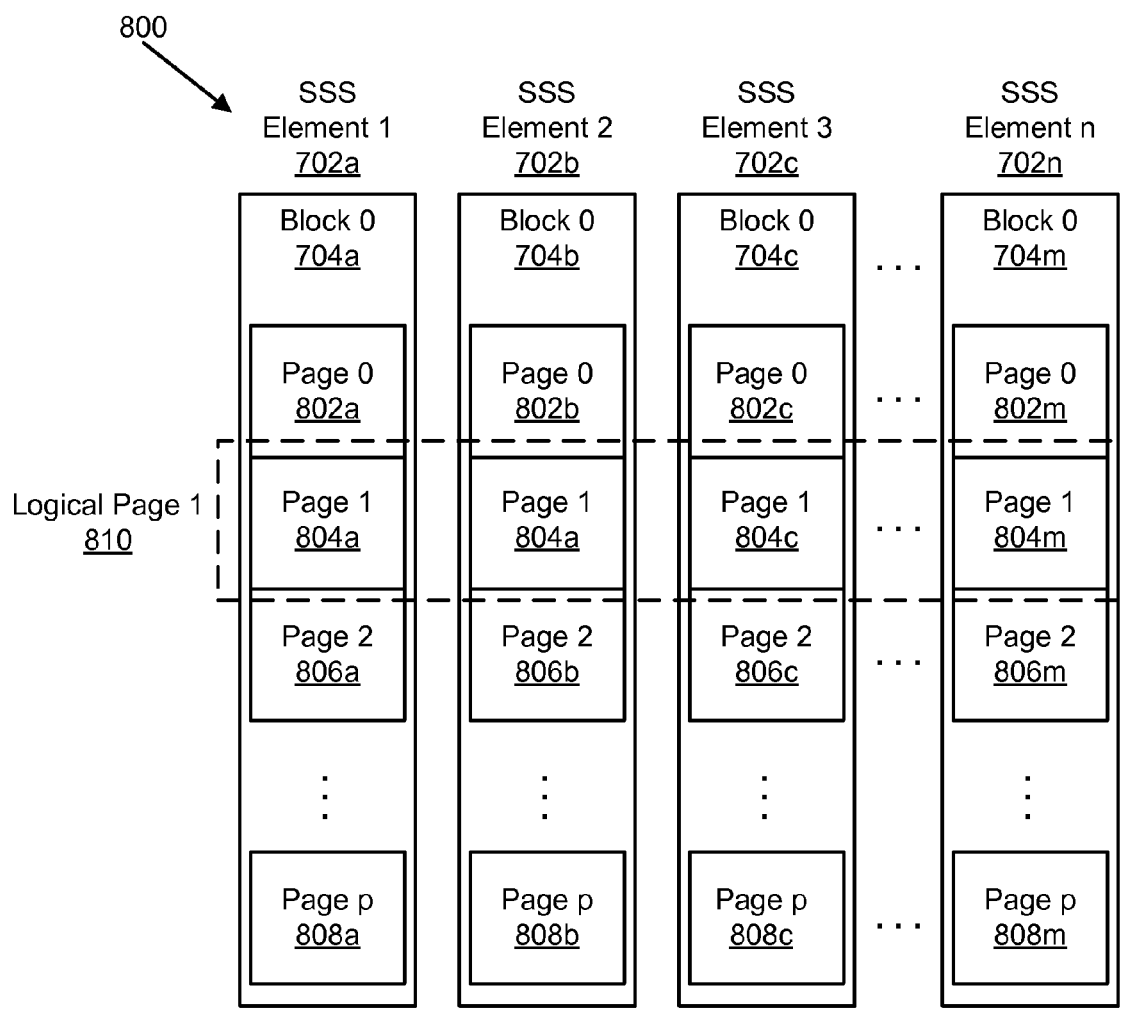
FIG. 8 is a schematic block diagram illustrating one embodiment of an array of solid-state storage devices depicting pages in a block in the array in accordance with the present invention.

FIG. 8 is a schematic block diagram illustrating one embodiment 800 of an array of solid-state storage devices depicting pages in a block in the array in accordance with the present invention. The embodiment 800 depicts a single block 0 for solid-state storage elements 1-p 702a-p. Each block 0 704 includes p pages, e.g. page 0 802, page 1 804, page 2 806, . . . page p 808. In one embodiment, block 0 704 is used to store bad block data.

If page 0 802 has bad block data, either compressed or uncompressed, after the bad block identifier module 202 identifies a bad block, the log updater module 204 updates the bad block log by writing the bad block location and possibly other relevant data, such as a replacement block location, into the next logical page, which is logical page 1 810. The process repeats for page 2 806, page 3, etc. In one embodiment, when page p 808 is written to with bad block data, the log compactor module 304 may compact the bad block data into one of the pages, such as page 0 802.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to map bad blocks in solid-state storage, the apparatus comprising:
 a bad block identifier module that identifies one or more data blocks as bad blocks, each bad block comprising a block determined to be inappropriate for data storage, each bad block on a solid-state storage element in an array of solid-state storage elements;
 a log update module that writes at least a location of each bad block ("bad block location") identified by the bad block identifier module into each of two or more redundant bad block logs, wherein, for at least one of the bad block logs, the log update module writes the one or more bad block locations into a page of a block comprising the bad block log, the page being free of previously written bad block location information; and
 a bad block mapping module that accesses at least one bad block log during a start-up operation to create in a memory a bad block map comprising a mapping between the bad block locations in the bad block log and a corresponding location of a replacement block ("replacement block location") for each bad block location, wherein data is stored in each replacement block instead of the corresponding bad block, the start-up operation comprising making operational a controller for the solid-state storage from a non-operational state, wherein the bad block mapping module creates the bad block map using one of
  a replacement block location stored with each bad block location in each of the bad block logs; and
  a bad block mapping algorithm that uses a storage order of the bad block locations in a bad block log to pair each bad block location with a replacement block location.

2. The apparatus of claim 1, further comprising a table updater module that updates the bad block map by mapping a replacement block location to a bad block location, the table updater module storing the mapping in the bad block map.

3. The apparatus of claim 1, further comprising a log compactor module that one of
 reads, in a block comprising a bad block log, each page storing one or more bad block locations, erases the pages storing bad block locations, and stores at least the bad block locations read from the pages together into one or more pages in the block comprising the bad block log ("compacted bad block pages"); and
 erases pages storing bad block locations and stores the bad block map in one or more pages of the block comprising the bad block log as compacted bad block pages.

4. The apparatus of claim 3, wherein the log update module, subsequent to the log compactor module storing bad block locations into the one or more compacted bad block pages, stores each additional bad block location corresponding to a bad block, subsequently identified by the bad block identifier module, in a separate page and in a page different than the one or more compacted bad block pages.

5. The apparatus of claim 4, wherein the log compactor module reads one or more compacted bad block pages and other pages storing a bad block location and stores the bad block locations in one or more compacted bad block pages.

6. The apparatus of claim 3, wherein the log compactor module reads pages and stores bad block locations in one or more compacted bad block pages in response to one or more of
 reaching a threshold of number of pages with bad block location information; and
 each available page in a bad block log having one or more bad block locations.

7. The apparatus of claim 1, further comprising a bad block recovery module that recovers valid data stored in an identified bad block and stores the data in a replacement block mapped to the bad block, wherein the bad block recovery module recovers the valid data using one of
 error correcting code ("ECC");
 a spare die or chip from which the valid data can be covered; and
 data stored in a stripe of a redundant array of independent drives ("RAID").

8. The apparatus of claim 1, further comprising a log consistency module that compares the two or more bad block logs and, if available, the bad block map and determines if the bad block logs and bad block map are consistent.

9. The apparatus of claim 8, wherein the log consistency module determines consistency of the bad block logs and bad block map in response to one or more of
 detecting an error while updating one or more of the bad block logs;
 the bad block mapping module creating the bad block map during a start-up operation;
 after an interruption while updating the two or more bad block logs;
 an ECC data correction failure;
 a periodic scrubbing;
 expiration of a period of time; and
 a command by a user.

10. The apparatus of claim 8, further comprising a log recovery module that uses a bad block log that is determined to be correct or the bad block map that is determined to be correct to correct a bad block log that is determined to be in error.

11. The apparatus of claim 8, wherein determining that two or more bad block logs are inconsistent comprises determining that a number of bad block locations in a bad block log or the bad block map are different than a number of bad block locations in at least one other bad block log.

12. The apparatus of claim 11, wherein the bad block log with a higher number of bad block locations is determined to be the bad block log with valid bad block location data unless the bad block log with a higher number of bad block locations is determined to contain invalid data using ECC checking.

13. The apparatus of claim 1, wherein a replacement block comprises a physical block within a retired logical block, the retired logical block comprising
 two or more physical blocks wherein at least one physical block is a physical block other than the replacement block and is a bad block; and
 a logical block available to store data that is marked as a retired logical block such that physical blocks in the logical block are available as replacement blocks.

14. The apparatus of claim 1, wherein a block comprising a bad block log comprises a logical block spanning two or more solid-state storage elements wherein error correcting code ("ECC") protects the logical block.

15. The apparatus of claim 1, wherein the bad block mapping module accesses at least one bad block log by accessing the block comprising the bad block log at a known physical location within the solid-state storage array, wherein the known physical location comprises one of a first block, a last block, a block of a predetermined number, and a block at a known offset into the solid-state storage array.

16. The apparatus of claim 1, further comprising a bad block log replacement module that;
   determines that a block comprising a bad block log is in a condition to be replaced;
   selects a block within a pool of blocks designated for bad block data storage; and
   writes bad block data into the selected block that is consistent with one of another bad block log and the bad block map.

17. The apparatus of claim 1, wherein the log update module further stores one or more of a time indicator and error data with the bad block location, the time indicator comprising a point in time or a point in a sequence, the point in time and point in sequence each associated with identification of the bad block.

18. The apparatus of claim 1, wherein a solid-state storage element comprises one of a solid-state storage chip and a solid-state storage die.

19. The apparatus of claim 1, wherein a block comprises an erase block.

20. A system to map bad blocks in solid-state storage, the system comprising:
   a solid-state storage array comprising two or more solid-state storage elements;
   a solid-state storage controller that controls the solid-state storage array;
   a bad block identifier module that identifies one or more data blocks as bad blocks, each bad block comprising a block determined to be inappropriate for data storage, each bad block on a solid-state storage element in the solid-state storage array;
   a log update module that writes at least a location of each bad block ("bad block location") identified by the bad block identifier module into each of two or more redundant bad block logs, wherein, for at least one of the bad block logs, the log update module writes the one or more bad block locations into a page of a block comprising the bad block log, the page being free of previously written bad block location information; and
   a bad block mapping module that accesses at least one bad block log during a start-up operation to create in a memory a bad block map comprising a mapping between the bad block locations in the bad block log and a corresponding location of a replacement block ("replacement block location") for each bad block location, wherein data is stored in each replacement block instead of the corresponding bad block, the start-up operation comprising making operational a controller for the solid-state storage from a non-operational state, wherein the bad block mapping module creates the bad block map using one of
      a replacement block location stored with each bad block location in each of the bad block logs; and
      a bad block mapping algorithm that uses a storage order of the bad block locations in a bad block log to pair each bad block location with a replacement block location.

21. The system of claim 20, further comprising a computer that includes the solid-state storage array.

22. A computer program product comprising a computer readable medium storing computer usable program code executable to perform operations for mapping bad blocks in solid-state storage, the operations of the computer program product comprising:
   identifying one or more data blocks as bad blocks, each bad block comprising a block determined to be inappropriate for data storage, each bad block on a solid-state storage element in an array of solid-state storage elements;
   writing at least a location of each identified bad block ("bad block location") into each of two or more redundant bad block logs, wherein, for at least one of the bad block logs, the one or more bad block locations are written into a page of a block comprising the bad block log, the page being free of previously written bad block location information; and
   accessing at least one bad block log during a start-up operation to create in a memory a bad block map comprising a mapping between the bad block locations in the bad block log and a corresponding location of a replacement block ("replacement block location") for each bad block location, wherein data is stored in each replacement block instead of the corresponding bad block, the start-up operation comprising making operational a controller for the solid-state storage from a non-operational state, wherein creating the bad block map comprises using one of
      a replacement block location stored with each bad block location in each of the bad block logs; and
      a bad block mapping algorithm that uses a storage order of the bad block locations in a bad block log to pair each bad block location with a replacement block location.

* * * * *